(12) United States Patent
Banerjee et al.

(10) Patent No.: US 6,707,132 B1
(45) Date of Patent: Mar. 16, 2004

(54) HIGH PERFORMANCE SI-GE DEVICE MODULE WITH CMOS TECHNOLOGY

(75) Inventors: Robi Banerjee, Gresham, OR (US); Derryl J. Allman, Camas, WA (US); David T. Price, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/288,410

(22) Filed: Nov. 5, 2002

(51) Int. Cl.[7] ............................................. H01L 31/117
(52) U.S. Cl. ............................. 257/616; 257/18; 257/19
(58) Field of Search ............................ 257/616, 18, 19

(56) References Cited

U.S. PATENT DOCUMENTS 5,357,119 A * 10/1994 Wang et al. .................. 257/18
5,906,708 A * 5/1999 Robinson et al. ............ 438/694
6,555,839 B2 * 4/2003 Fitzgerald .................... 257/18
2003/0122154 A1 * 7/2003 Babcock et al. ............ 257/197

* cited by examiner

*Primary Examiner*—David Nelms
*Assistant Examiner*—Tu-Tu Ho
(74) *Attorney, Agent, or Firm*—Trexler, Bushnell, Giangiori, Blackstone & Marr, Ltd.

(57) ABSTRACT

A semiconductor device wherein some parts of a circuit are disposed on Si—Ge regions and others are implemented in Silicon substrate regions of the chip. The Si—Ge region provides that carrier flow is forced to the surface channel region which helps reduce short channel effects. A method of making such a semiconductor device is also provided and includes steps of forming a thermal oxide layer on a Silicon substrate, masking at least a portion of the thermal oxide layer, removing at least a portion of the thermal oxide layer in order to expose a portion of the Silicon substrate, epitaxially growing an Si—Ge layer on the exposed portion of the Silicon substrate, epitaxially growing a Silicon layer on the Si—Ge layer, and continuing manufacture of the device by forming a circuit on the Si—Ge regions and non-Si—Ge regions of the semiconductor device.

18 Claims, 4 Drawing Sheets

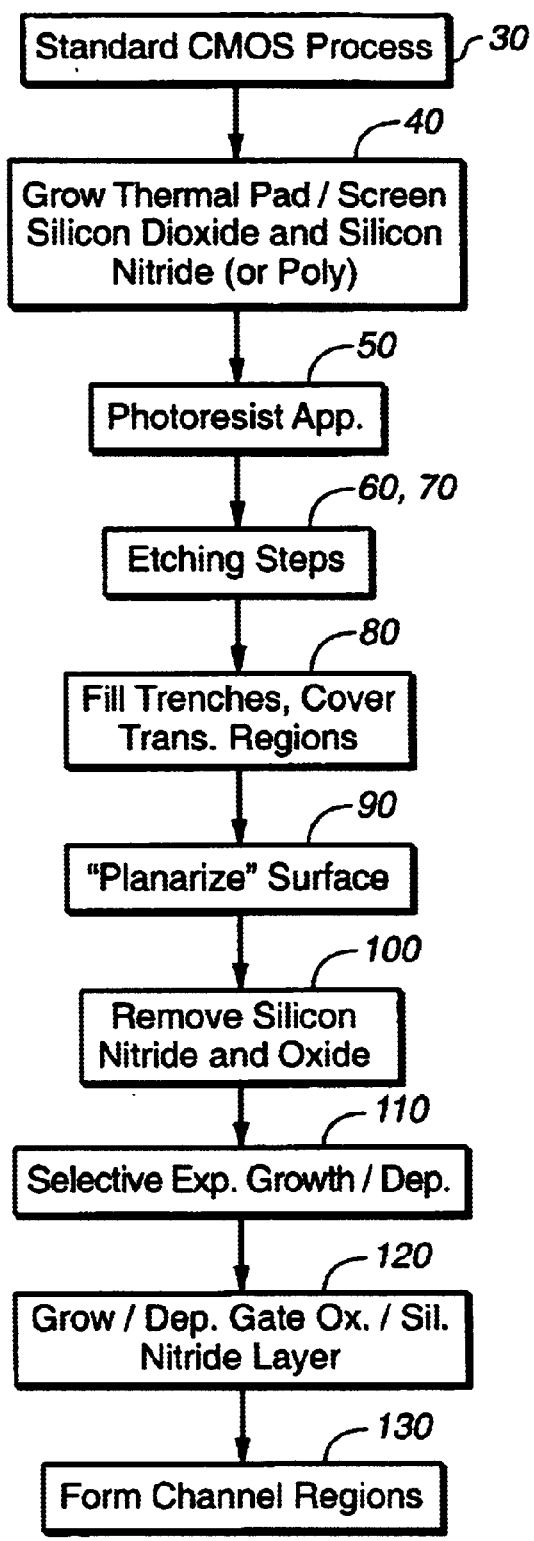
FIG._1

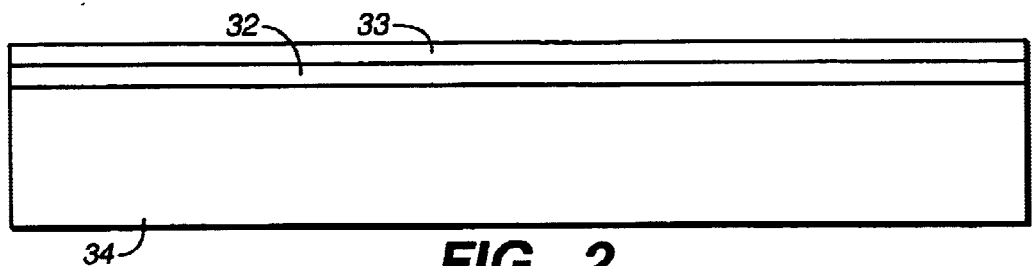
FIG._2
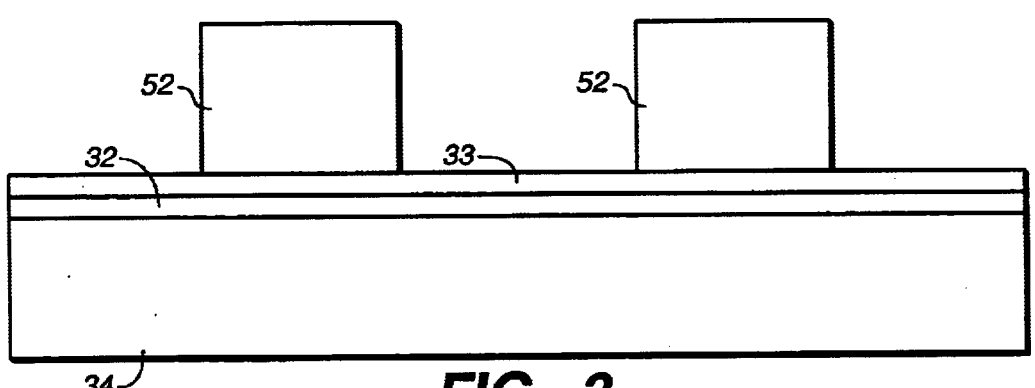
FIG._3
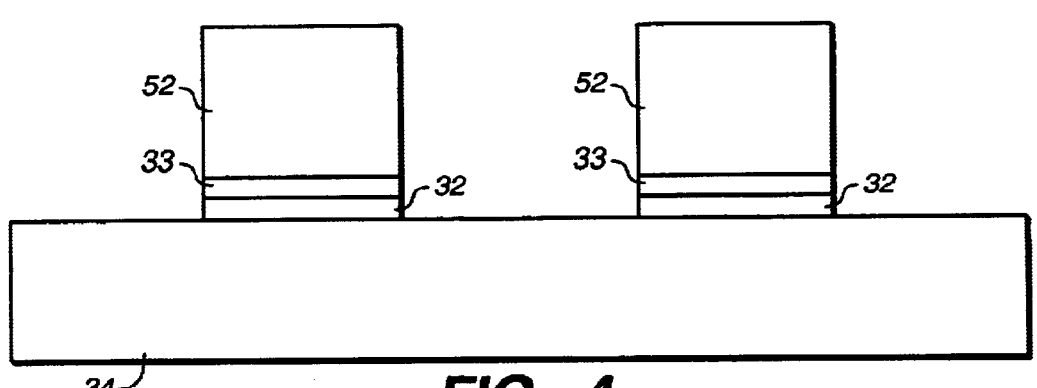
FIG._4
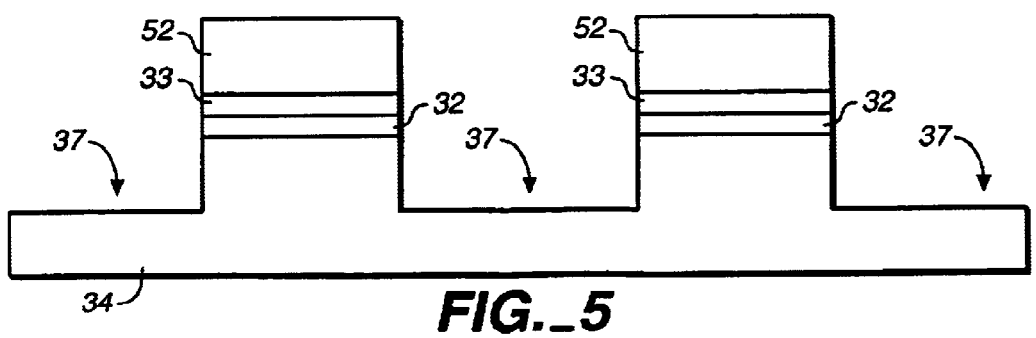
FIG._5

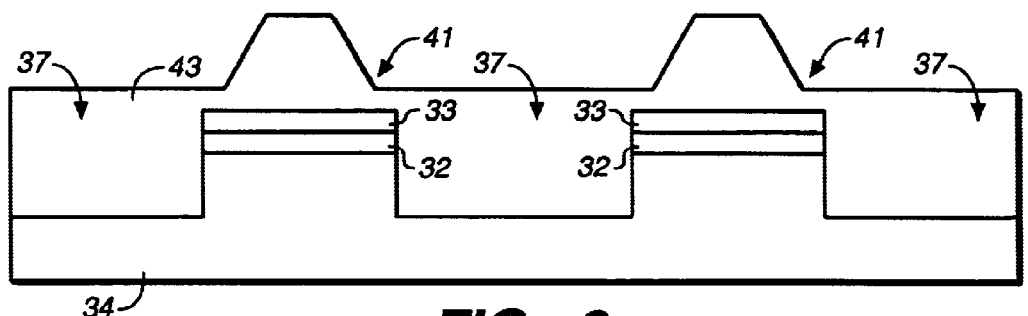
FIG._6
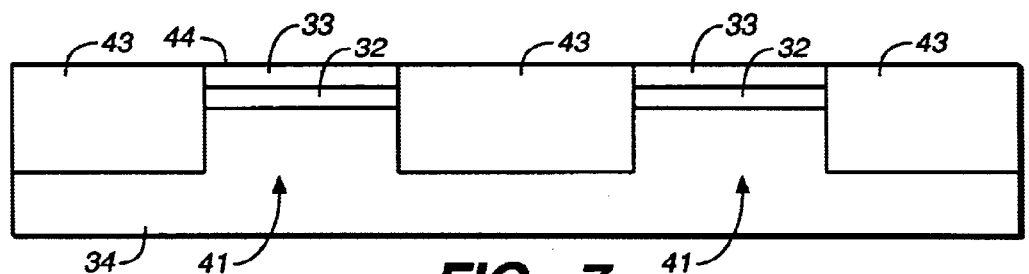
FIG._7
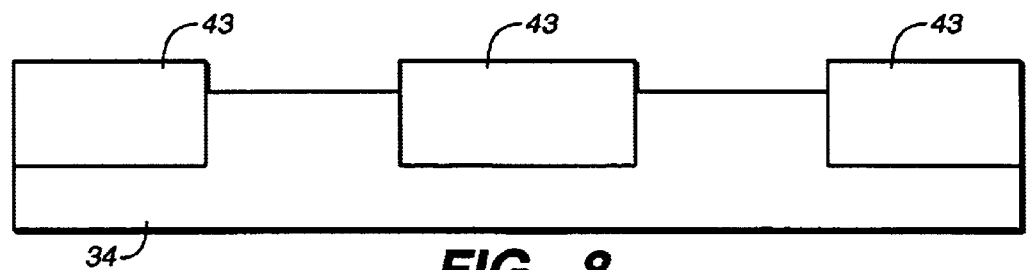
FIG._8
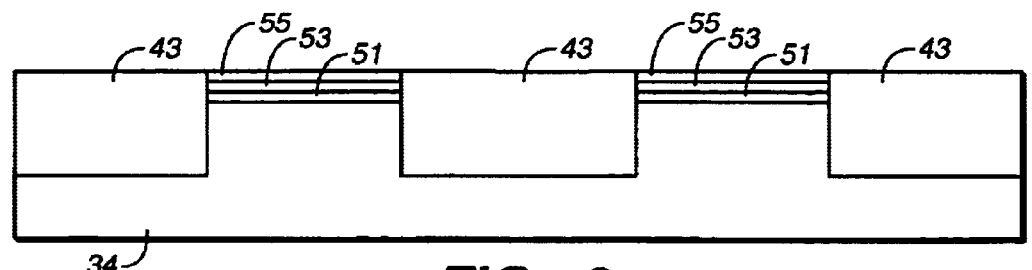
FIG._9

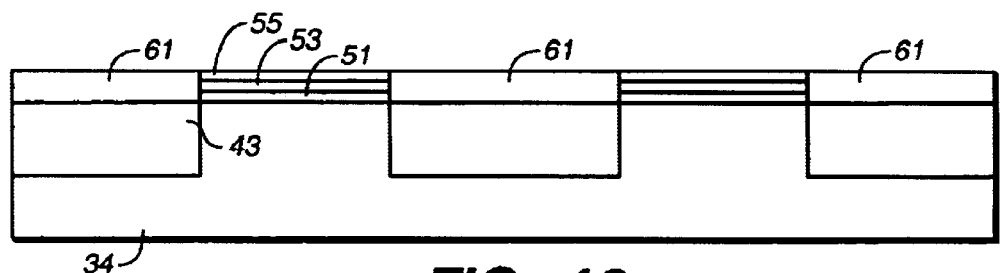
FIG._10
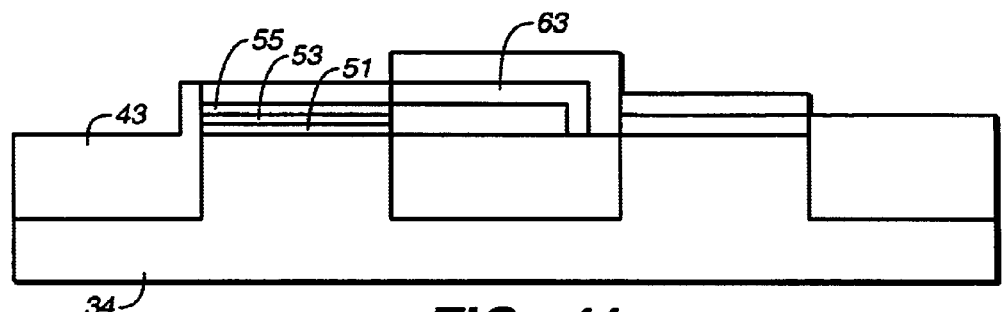
FIG._11
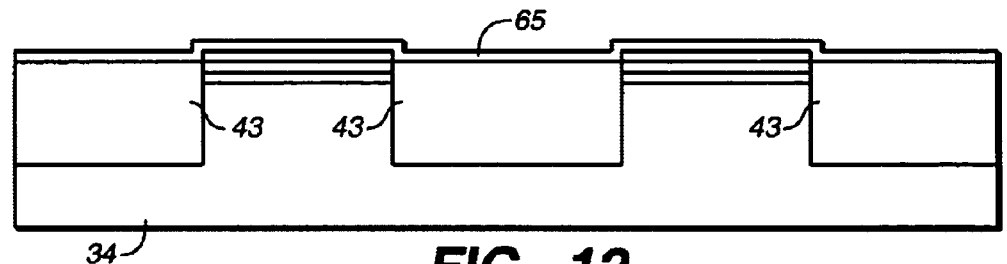
FIG._12
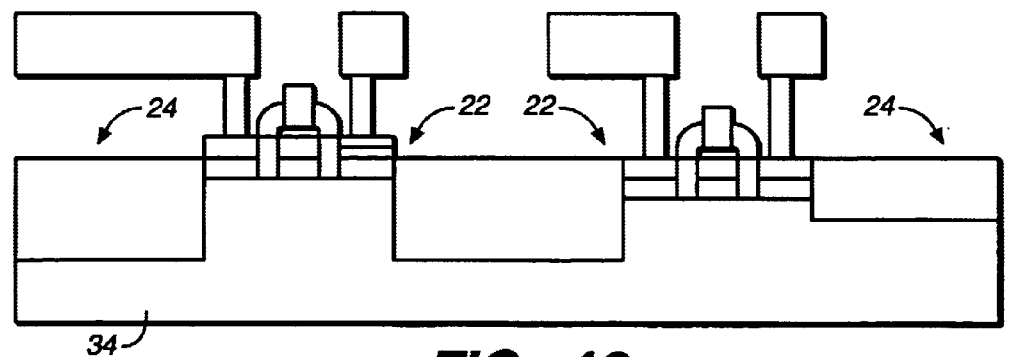
FIG._13

HIGH PERFORMANCE SI-GE DEVICE MODULE WITH CMOS TECHNOLOGY

BACKGROUND

The present invention generally relates to semiconductor process integration, and more specifically relates to a semiconductor device which has Si—Ge on Silicon, and a method of making a semiconductor device where the method includes depositing Si—Ge on Silicon.

The semiconductor industry has been constantly striving to improve the performance of semiconductor devices (i.e., semiconductor products). To date, various schemes and improvements have been proposed, both in the area of process technology and circuit design, in order to improve speed, reduce power consumption, or otherwise improve performance.

Present semiconductor devices are typically configured such that FET transistors and other devices, such as speed-performance sensitive parts of a circuit, are disposed on Silicon. The scaling of transistors to smaller dimensions for reduced die size, increased logic functionality and reduced power has resulted in a decrease in the operational performance of a transistor. The drop in transistor drive currents reduces the performance of a circuit and increases the dynamic power consumption. The reduction in the drive current results from a decrease in the mobility of the electron due to increased surface and impurity scattering in the surface channel of the device.

OBJECTS AND SUMMARY

A general object of an embodiment of the present invention is to provide a semiconductor device which has at least a region that provides Si—Ge on Silicon.

Another object of an embodiment of the present invention is to provide a method of making a semiconductor device, where the method includes depositing Si—Ge on Silicon.

Still another object of an embodiment of the present invention is to provide a semiconductor device which is configured such that carrier flow is confined or near the surface of the device.

Still yet another object of an embodiment of the present invention is to provide a semiconductor device which is configured such that it reduces leakage and power consumption.

Yet still another object of an embodiment of the present invention is to provide a semiconductor device which is configured such that electron hole carrier mobility is improved, thereby resulting in improved transistor performance.

Briefly, and in accordance with at least one of the forgoing objects, an embodiment of the present invention provides a semiconductor device which has at least a region where Si—Ge is disposed on Silicon. Specifically, the semiconductor device preferably includes Si—Ge disposed on a Silicon substrate. The semiconductor device may include a Silicon region which does not include any Si—Ge, but preferably also includes an Si—Ge region which includes Si—Ge on Silicon. While the Silicon region includes a thermal oxide layer, the Si—Ge region does not. Preferably, the Si—Ge is provided as an Si—Ge layer which is disposed between a Silicon layer and the Silicon substrate. Ideally, there is at least one circuit device or circuitry on the Silicon region and at least one circuit device or circuitry on the Si—Ge region. The lattice structure in the silicon layer grown above the Si—Ge layer is strained due to the lattice mismatch between the epitaxial Si—Ge and Si regions. This strained silicon layer results in less electron scattering, which improves electron mobility and results in improved transistor switching speed and lower dynamic power consumption. These layers of Germanium doped silicon and Strained silicon do not have to be selectively grown on the surface of the exposed substrate. These films can be grown on the surface of the exposed substrate and at the same time depositing a poly crystalline version of the film on the surface above the silicon dioxide layers. The thickness of these poly crystalline layers can be thinner or thicker than the epitaxial grown layers.

A method of making such a semiconductor device is also provided, and includes steps of forming a thermal oxide layer on a Silicon substrate, masking at least a portion of the thermal oxide layer, removing (such as by wet etching) at least a portion of the thermal oxide layer in order to expose a portion of the Silicon substrate, epitaxially growing an Si—Ge layer selectively on the exposed portion of the Silicon substrate using either undoped Si—Ge or Si—Ge doped with carbon, epitaxially growing a Silicon layer on the Si—Ge layer using either undoped Silicon or Silicon doped with nitrogen, and continuing manufacture of the device by forming a circuit on the Si—Ge regions and non-Si—Ge regions of the semiconductor device.

BRIEF DESCRIPTION OF THE DRAWINGS

The organization and manner of the structure and operation of the invention, together with further and advantages thereof, may best be understood by reference to the following description, taken in connection with the accompanying drawings, wherein like reference numerals identify like elements in which:

FIG. 1 is a block diagram of a method which is in accordance with an embodiment of the invention; and FIGS. 2–13 are general schematic view of a semiconductor device illustrating steps of the method shown in FIG. 1.

Description

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

FIG. 1 illustrates, in block diagram form, a method 10 of making a semiconductor device, and FIGS. 2–13 illustrate a semiconductor device 20 being made in accordance with the steps shown in FIG. 1. Both the method 10 of making the semiconductor device 20 and the structure of the semiconductor device 20 itself are embodiments of the present invention.

Generally, the method 10 shown in FIG. 1 includes the step of depositing Si—Ge on Silicon. As a result, both Si—Ge regions 22 and Silicon regions 24 are formed on the semiconductor device 20 (see FIG. 13). This provides that speed performance sensitive parts of the circuit may be built on the Si—Ge region(s) within the die, while non-speed sensitive designs or legacy designs on Silicon may be implemented in the Silicon region(s) on the chip.

In addition to depositing Si—Ge on Silicon, Silicon is deposited on the Si—Ge. Due to lattice mismatch between Si—Ge and Silicon, the carrier mobility is improved, thereby improving the performance of the semiconductor device. Specifically, higher electron hole carrier mobility results in improved speed for logic circuit circuits of the semiconductor device. Additionally, the strain causes the carriers to be restricted to the surface Silicon layer. This improves short channel effects thereby reducing leakage and therefore standby power consumption.

The method 10 shown in FIG. 1 provides that initially there is standard CMOS process flow up to pattern zero mask layer to define initial alignment marks (box 30 in FIG. 1). Then, as shown in FIG. 2, a thermal oxide layer (SiO2) 32 and Silicon Nitride (or Poly) layer (Si3N4) 33 is screened onto the Silicon substrate 34 (box 40 in FIG. 1). Then, as shown in FIG. 3, there is a photoresist application and exposure (box 50 in FIG. 1; the resist is shown as part 52 in FIG. 3) to define where a transistor device will be placed 54). Then, as shown in FIG. 4, the portion(s) of the thermal oxide layer 32 and silicon nitride layer 33 which have not been masked in the previous step arm removed, such as by plasma etching, thereby exposing the Silicon substrate (box 60 in FIG. 1).

Subsequently, as shown in FIG. 5, the silicon 32 is etched to form trenches 37, and the photoresist 52 is removed (box 70 in FIG. 1). Then, as shown in FIG. 6, the trenches 37 are filled and the transistor regions 41 are covered with Silicon dioxide 43, preferably using an HDP deposition method (box 80 in FIG. 1). A thin layer of thermal oxide can also be utilized prior to deposition to remove etch damage.

Then, as shown in FIG. 7 (box 90 in FIG. 1), an oxide CMP polish is performed or the oxide is removed from the surface 44 to make it planar to the tops of the Silicon Nitride layers 33 above the transistor regions 41. Part of the Silicon Nitride is removed in the Oxide CMP polish.

The following steps can be repeated to form either 1) P or N doped region, 2) regions of higher Ge doping, 3) regions of different nitrogen concentrations on the surface of the exposed silicon regions. To accomplish this, the wafer can be masked so that only some of the silicon transistor regions will be exposed. To shield the previous SEG or deposited layer from the next, a capping layer of Silicon Nitride or silicon dioxide can be deposited at the end of each deposition.

FIGS. 8—13 shown the formation, for example, of a P type region. As shown in FIG. 8 (box 100 in FIG. 1), the Silicon Nitride and oxide layers are removed, such as by using a wet etch process, leaving the surface of the oxide in the trench above the transistor island level.

As shown in FIG. 9 (box 110 in FIG. 1), at this point a selective expitaxial growth (SECT) of the Si—Ge. Strained Si layers 51, 53, 55 can occur. The Si—Ge layer can be doped with Carbon (or Nitrogen) and put of the Strained Si layer can be doped with Nitrogen and Boron (graded as shown). Prior to starting the growth the surface of the exposed silicon substrate will be cleaned insitu using a hydrogen or HCL gas. This clean is a reduction of the passivating oxide on the surface of the silicon. The HCL gas can also be used to remove metallics.

Optionally, the Si—Ge and Strained silicon layer does not have to be grown selectively, this layer can be deposited. Where silicon is exposed on the substrate epitaxial growth will occur while over the silicon dioxide the deposited layer will be poly crystalline 61 (see FIG. 10). The thickness of this layer can be adjusted by deposition conditions (Thinner or slightly thicker than the epitaxial silicon). This option allows for the formation of thin film transistors on the silicon dioxide surface (higher Ge content is needed) or the poly crystalline layer can be etched to from local interconnect between transistors. Additionally, these poly crystalline regions can be used to form capacitors for DRAM or analog applications when the process is repeated to form regions of different doping concentrations on the surface of the substrate. Once again, the nitrogen doping of the strained silicon layer is optional.

Optional Capacitor formation 63 is shown in FIG. 11. The capacitor 63 does not have to be only connected to the SEG regions but can be contacted later during either the metalization steps or during other SEG depositions.

FIG. 12 shows the formation of the SEG regions and FIG. 13 shows subsequent formation of N type channel region. As shown in FIG. 12 (box 120 in FIG. 1), following the formation of the SEG regions, the growth of a gate oxide or deposition of a thin silicon nitride layer 65 can occur. The gate oxide growth can occur after tho SEC growth in the reactor or in another tool. If different gate oxide thickness are desired on the surface of the substrate the wafer can be masked and additional nitrogen can be added to selected regions by implantation. The implant is centered at the surface of the SEG layer Nitrogen retards the growth or the silicon dioxide film and when incorporated in the silicon dioxide acts as a barrier for boron diffusion out of the channel or from the gate electrode (formed later during the process).

As shown in FIG. 13 (box 130 in FIG. 1), the next step is to post-form the P and N type channel regions (only an Ntype region is shown in FIG. 13) with different gate oxide regions across the surface of the substrate 34. Conventional semiconductor process steps may be used to form the transistors, except that the time and temperature of the source and drain dopant activation anneal temperatures must be kept short and low enough so that the strained silicon layer remains.

The method provides a novel and simple scheme to integrate on-chip selective area Si—Ge on Si for high performance surface FET (CMOS) devices. Advantages of the process include the fact that the use and integration allows circuit performance improvement as measured by speed of circuit, while allowing the use of legacy non-SOI designs. For example, a SRAM memory block may be included in the Silicon regions of the chip, while the speed performance sensitive Logic circuit (state machine) maybe included in the Si—Ge on Silicon region. This enables both high-performance Si—Ge on Silicon and standard Silicon-based circuit designs to co-exist on a chip. Furthermore, power consumption is reduced, and the same performance can be obtained by running the logic part of the circuit at a lower voltage. Still further, the method uses existing material and equipment set, yet provides an elegant integration solution. Additionally, there is the option of incorporating high performance bipolar devices in the flow.

While embodiments of the present invention are shown and described, it is envisioned that those skilled in the art may devise various modifications of the present invention without departing from the spirit and scope of the appended claims.

What is claimed is:

1. A semiconductor device comprising:
   a Silicon substrate; and
   Si—Ge on the Silicon substrate;
   wherein said semiconductor device includes a Silicon region which does not include any Si—Ge, and includes a Si—Ge region which includes Si—Ge on the Silicon substrate;

further comprising at least one circuit device on the Silicon region and at least one circuit device on the Si—Ge region.

2. A semiconductor device as defined in claim 1, further comprising a Silicon layer, wherein the Si—Ge on the Silicon substrate forms a Si—Ge layer, said Silicon layer being disposed on the Si—Ge layer, said Si—Ge layer being disposed between said Silicon substrate and said Silicon layer.

3. A semiconductor device as defined in claim 2, further comprising a poly crystalline region and a capacitor formed in said poly crystalline region.

4. A semiconductor device as defined in claim 3, wherein the capacitor is connected to the Si—Ge.

5. A method of making a semiconductor device comprising;

providing a Silicon substrate: and depositing Si—Ge on the Silicon substrate;

further comprising forming a thermal oxide layer on the Silicon substrate;

further comprising masking at least a portion of the thermal oxide layer which is disposed on the Silicon substrates;

further comprising removing at least a portion of the thermal oxide layer which is disposed on the Silicon substrate in order to expose a portion of the Silicon substrate;

further comprising forming a Si—Ge layer on the exposed portion of the Silicon substrate.

6. A method as defined in claim 5, further comprising forming a Silicon layer on the Si—Ge layer which is disposed on the Silicon substrate.

7. A method as defined in claim 6, wherein the step of forming a Silicon layer on the Si—Ge layer comprises epitaxially growing the Silicon layer.

8. A method as defined in claim 7, further comprising epitaxially growing the Silicon layer using Silicon doped with nitrogen.

9. A method as defined in claim 7, further comprising forming a poly crystalline region and forming a capacitor in said poly crystalline region.

10. A method as defined in claim 9, further comprising connecting the capacitor to the Si—Ge.

11. A method as defined in claim 6, wherein the step of forming the Silicon layer on the Si—Ge layer comprises forming the Silicon layer such that the Silicon layer has a thickness of less than 100 A.

12. A method as defined in claim 5, wherein the step of forming a Si—Ge layer on the exposed portion of the Silicon substrate comprises epitaxially growing the Si—Ge layer.

13. A method as defined in claim 12, further comprising epitaxially growing the Si—Ge layer using undoped Si—Ge.

14. A method as defined in claim 12, further comprising epitaxially growing the Si—Ge layer using Si—Ge doped with carbon.

15. A method as defined in claim 14, further comprising epitaxially growing the Si—Ge layer using Si—Ge doped with 0.2 to 1.5 atm % of carbon.

16. A method as defined in claim 5, wherein the step of removing at least a portion of the thermal oxide layer comprising wet etching the portion of the thermal oxide layer.

17. A method as defined in claim 5, further comprising forming a poly crystalline region and forming a capacitor in said poly crystalline region.

18. A method as defined in claim 17, further comprising connecting the capacitor to the Si—Ge.

* * * * *